United States Patent [19]

Duyn

[11] Patent Number: 5,544,652
[45] Date of Patent: Aug. 13, 1996

[54] ULTRAFAST BURST IMAGING USING SHIFTING OF EXCITED REGIONS

[75] Inventor: Jozef H. Duyn, Kensington, Md.

[73] Assignee: The United States of America as represented by the Department of Health and Human Services, Washington, D.C.

[21] Appl. No.: 205,434

[22] Filed: Mar. 4, 1994

[51] Int. Cl.$^6$ ..................................................... A61B 5/055
[52] U.S. Cl. ........................................ 128/653.2; 324/309
[58] Field of Search ......................... 128/653.2; 324/307, 324/309

[56] References Cited

U.S. PATENT DOCUMENTS

| | | | |
|---|---|---|---|
| 5,126,673 | 6/1992 | Hennig | 324/309 |
| 5,212,448 | 5/1993 | Le Roux et al. | 324/309 |
| 5,225,780 | 7/1993 | Riederer et al. | |
| 5,241,271 | 8/1993 | Taguchi et al. | |
| 5,243,283 | 9/1993 | Tokunaga et al. | |

OTHER PUBLICATIONS

Proceedings, 7th Annual Meeting, Society of Magnetic Resonance in Medicine, 1988, p. 238. "Fast Imaging Using burst Excitation Pulses" by Henning et al.
J. Magn. Reson. B. 101, pp. 106–109 (1993) "Dante Ultrafast Imaging Sequence (DUFIS)" by Lowe et al.
Proceedings, 7th Annual Meeting, Society of Magnetic Resonance in Medicine, 1991, p. 269 "Burst Ultrafast Excitation Pulses" by Le Roux et al.

*Primary Examiner*—Ruth S. Smith
*Attorney, Agent, or Firm*—Lowe, Price, LeBlanc & Becker

[57] ABSTRACT

An ultrafast BURST imaging method in which burst RF pulses are repeatedly used to excite equally spaced, narrow section strips in an object. The location of the excited section strips of the object is shifted between successive repetitions of the burst RF pulses by at least one strip width. This shifting avoids saturation effects and allows for three dimensional imaging and averaging a repeated series of scans.

14 Claims, 6 Drawing Sheets

ULTRAFAST BURST IMAGING USING SHIFTING OF EXCITED REGIONS

TECHNICAL FIELD

The present invention relates to nuclear magnetic resonance imaging methods and systems. More particularly, the present invention relates to an ultrafast BURST imaging technique in which the location of the excited strip regions is shifted on successive excitation repetitions.

BACKGROUND ART

Over the past few years, interest has grown in fast imaging techniques. In particular, the recent exploitation of contrast mechanisms based on physiology dependent microscopic susceptibility ($T_2^*$) effects has resulted in an explosive growth of the field of MR neuro-imaging, and has led to increasing demands on $T_2^*$ sensitized fast MRI. Among the most popular techniques are echo-planar imaging (EPI), fast low angle—shot imaging (FLASH), and echo-shifted FLASH (ES-FLASH), each with its own advantages and disadvantages.

BURST imaging is a class of ultra fast imaging techniques initially proposed by Henning et al ("Fast Imaging Using BURST Excitation Pulses" in "Proceedings, 7th Annual Meeting, Society of Magnetic Resonance in Medicine, 1988", p. 238), and successfully implemented in a two-dimensional (2D) version by Lowe et al ("DANTE Ultrafast Imaging Sequence (DUFIS)", *J. Magn. Reson.* B 101, pp. 106–109 (1993)) on a small-bore animal scanner. A version with improved signal to noise ratio (SNR) has been proposed by Le Roux et al ("BURST Ultrafast Excitation Pulses" in "Proceedings, 7th Annual Meeting, Society of Magnetic Resonance in Medicine, 1991", p. 269).

Conventional BURST excites a set of equally spaced, narrow strips in an object, and creates an image from a single slice, perpendicular to the direction of the strips. In order to average, to scan multiple slices, or for three-dimensional (3D) imaging, repeated excitation of the same strips is required.

For ultra fast scanning, repetition times are short compared to the longitudinal relaxation time, leading to saturation effects and thus efficiency loss. In addition, when scanning in a 2D mode, the commonly used slice selective RF refocusing pulse also leads to additional saturation.

The present invention is directed to a method, (hereafter referred to as "Frequency-Shifted BURST" (or "FS-BURST")), which overcomes the above problems associated with prior art methods and allows for 3D volumes to be scanned within a few seconds.

DISCLOSURE OF THE INVENTION

It is accordingly one object of the present invention to provide a method of three-dimensional magnetic resonance imaging which utilizes BURST RF excitation pulses.

Another object of the present invention is to provide a method of three-dimensional magnetic resonance imaging which utilizes BURST RF excitation pulses and shifts the excitation region after successive excitation repetitions.

A further object of the present invention is to provide a method of magnetic resonance imaging which utilizes BURST RF excitation pulses and reduces saturation effects.

A further object of the present invention is to provide a method of magnetic resonance imaging which utilizes burst RF excitation pulses and reduces saturation effects while improving the signal to noise ratio.

According to these and further objects of the present invention which will become apparent as the description thereof proceeds, the present invention provides a method of nuclear magnetic resonance imaging an object which involves the steps of:

a) positioning an object in a static magnetic field;

b) applying a magnetic field gradient to said object;

c) applying a burst of RF pulses to the object together with a slice selection gradient to excite a set of strips of the object has been inserted after "object";

d) collecting a set of spin-echo signals produced in step b);

e) repeating steps c) and d) a number of times after shifting a location of the excited strips of the object on successive repetitions by at least one strip width; and f) producing an image of the object from the sets of spin-echo signals.

The present invention further provides an improvement over prior BURST imaging methods which involves repeated application of burst RF pulses a number of times and shifting a location of the excited strips of an object between successive repetitions of the burst RF pulses by at least one strip width.

BRIEF DESCRIPTION OF DRAWINGS

The present invention will be described with reference to the attached drawings which are given by way of non-limiting examples only, in which.

BEST MODE FOR CARRYING OUT THE INVENTION

Figure 1:
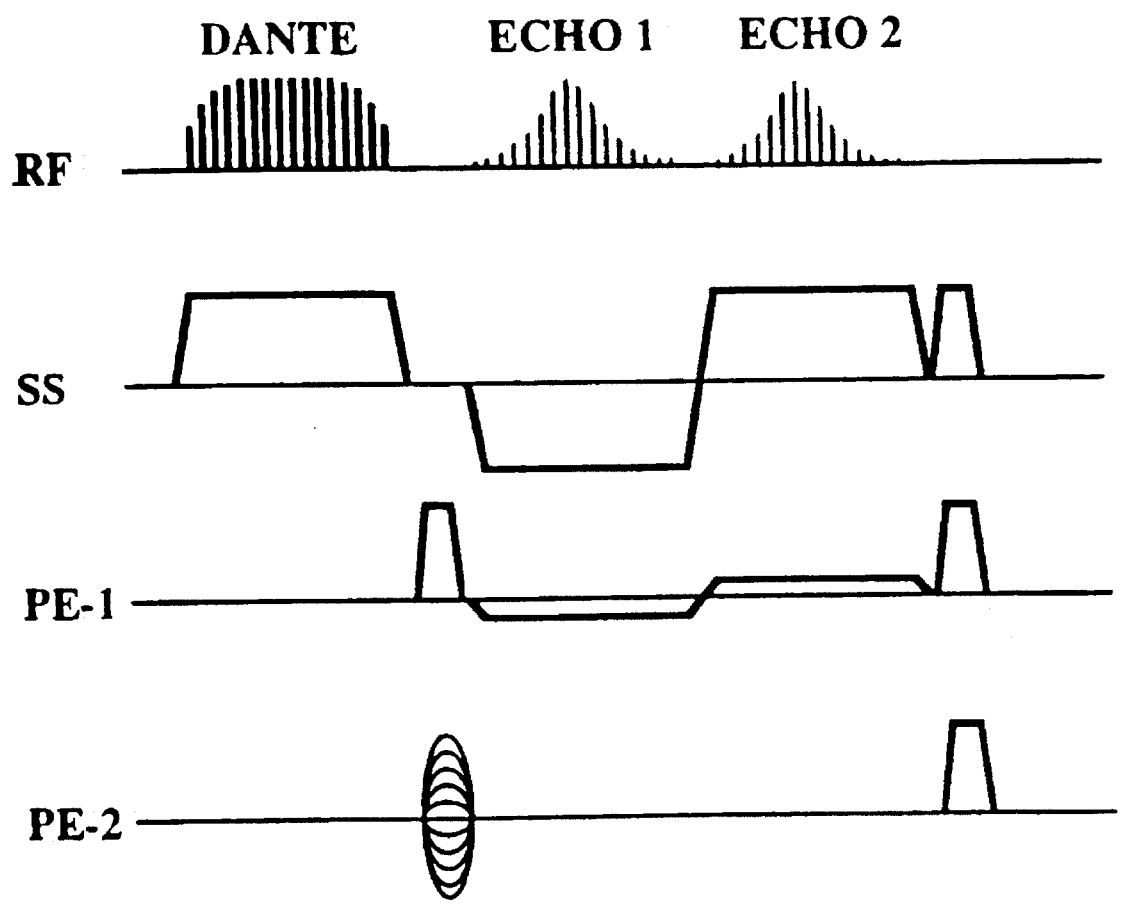
FIG. 1 is a 3D FS-BURST pulse sequence diagram according to the present invention.

The present invention is directed a modified BURST imaging technique which allows 3D volume imaging utilizing BURST imaging techniques for the first time. According to the present invention a set of equally spaced narrow strips of an object are excited utilizing a BURST type RF pulse. The BURST type RF pulse includes a plurality of evenly spaced RF pulses which can include 15 to 75, and more preferably about 25 to 50 pulses of equal strength. From the excited strips, an image from a single slice, perpendicular to the direction of the strips is obtained. In order obtain a 3D image a series of imaged slices is collected. However, in order to avoid repeated excitation of the same strips and resulting saturation, the present invention shifts the location of the excited strips on successive repetitions. This shifting is performed by adding incremental offsets to the RF-frequency of the BURST type RF pulse.

Experiments have shown that it is only necessary to shift the excited regions a distance of a single strip width. However, further shifting, e.g. multiple strip widths can also be used for purposes of the present invention. In practice, 3D datasets on a human brain can be collected within a few seconds utilizing a standard clinical scanner at 1.5 Tesla.

In addition to allowing for 3D volume imaging, the technique of the present invention can also be used to average a repeated series of scans while avoiding repeated excitation of the same strips and resulting saturation.

The present invention has been used to produce quality images of a human brain, thus demonstrating the validity of the strip-shift principle to reduce saturation effects. Furthermore, it was discovered that no susceptibility related artifacts were seen in images obtained from a second echo train when equal gradient amplitudes were used during excitation and readout periods.

Because only a fraction of the magnetization within an imaging voxel is excited in each repetition, the gain in speed with BURST-imaging comes with the price of a reduced SNR. As compared to 3D FLASH imaging with very short repetition times (TR), the reduction in SNR with FS-BURST is not dramatic. This is due to the fact that FLASH, with its low flip angles at short TR, excites only a small fraction of the rest magnetization per repetition.

A clear advantage of the FS-BURST technique of the present invention over other fast imaging techniques is that it is less demanding with regard to gradient slew rates, even at very high imaging speeds. The small number of gradient switchings in the BURST type RF excitation pulses lessens demand on gradient slew rates, and reduces eddy current effects. The major physical limitation on further increasing speed is the maximum strength of the read gradient, and the bandwidth of digitizer/receiver combination.

In the FS-BURST imaging technique of the present invention all echoes of the second echo train have identical $T_2^*$ weighing. This makes FS-BURST an attractive candidate for susceptibility-based neuro-imaging experiments, and particularly 3D bolus tracking neuro-imaging.

Features of characteristics of the present invention, some of which are mention above, will be hereafter described with reference to several experiments which were conducted during the course of the invention.

All experiments described below were performed on a standard 1.5 RGE/SIGNA clinical scanner (GE Medical systems, Milwaukee), equipped with 10 mT/m, actively shielded whole body gradients. A standard quadrature head RF coil was used. The maximum RF output power was 2 kW, and the RF dwell time was 2 µs. The receiver had a band width of 125 kHz (complex points). The human subject protocol was approved by the intramural review board of the National Institute of Mental Health at National Institute of Health.

The pulse sequence used for 3D FS-BURST is shown in FIG. 1. The excitation consists of a Hamming-apodized BURST RF-pulse in combination with a slice selection (SS) gradient. Two echo trains (ECHO 1, ECHO 2) were created by repeated gradient reversal. Both echo trains were phase encoded in two directions by PE-1 and PE-2. A gradient crusher was applied after collection of the second echo. The BURST pulse consisted of a train of 48 evenly spaced RF pulses. To improve the RF frequency profile and the resulting strip profile, a Hamming filter was applied over 50% of the pulse train. The individual RF pulses were 128 µs long, and were apodized with a combination of a double sidelobed sinc and a gaussian function to improve the profile of the selected slab. The pulse spacing was 384 µs. Total BURST pulse length was 18.2 ms. The selection gradient was applied simultaneously in anterior-posterior and superior-inferior directions, using maximum gradient strength in both directions. This resulted in selection of 120 mm thick slab with 45° angulation. The total nutation angle of the BURST pulse was between 70° and 90° for the center of each strip. An echo train of 48 echoes was generated for each of the two reversals of the selection gradient. 48 Data points were acquired per echo, and the echoes were phase encoded in the left-right direction by application of a continuous gradient (PE-1 in FIG. 1). This gradient was reversed on subsequent echo trains.

Effective echo times of first and second echo train were 19.7 ms and 42.5 ms respectively. A third gradient direction (combination of posterior-anterior and superior-inferior, PE-2 in FIG. 1) was used to phase encode the subsequent repetitions. Also, on subsequent repetitions, incremental offsets were added to the RF-frequency to effectively shift the location of the excited strips. Two different shifting protocols were used: the first one used a shift of single strip width, the second one used a shift of seven strip widths (modulo 48) on successive scans. The repetition time (TR) was 65 ms.

A 48×48×48 data matrix was collected using a 21 cm×21 cm×22 cm field of view (FOV). The 22 cm FOV was used in the slice select direction and was limited by the maximum effective gradient strength of 14 mT/m. The total measurement time was 3.1 seconds. For repeated scans a wait period of 15 s was observed to prevent overheating of the gradients.

Data processing was performed off-line on Sun-SPARC workstations (Sun Microsystems, Mountainview, Calif.) using IDL processing software (Research Systems, Boulder, Colo.). Prior to 3D Fourier transformation, a 20% Hamming filter was applied over each echo, and over the second phase encode dimension. This resulted in an effective resolution of 4.5×4.5×4.7 mm.

Figure 2:
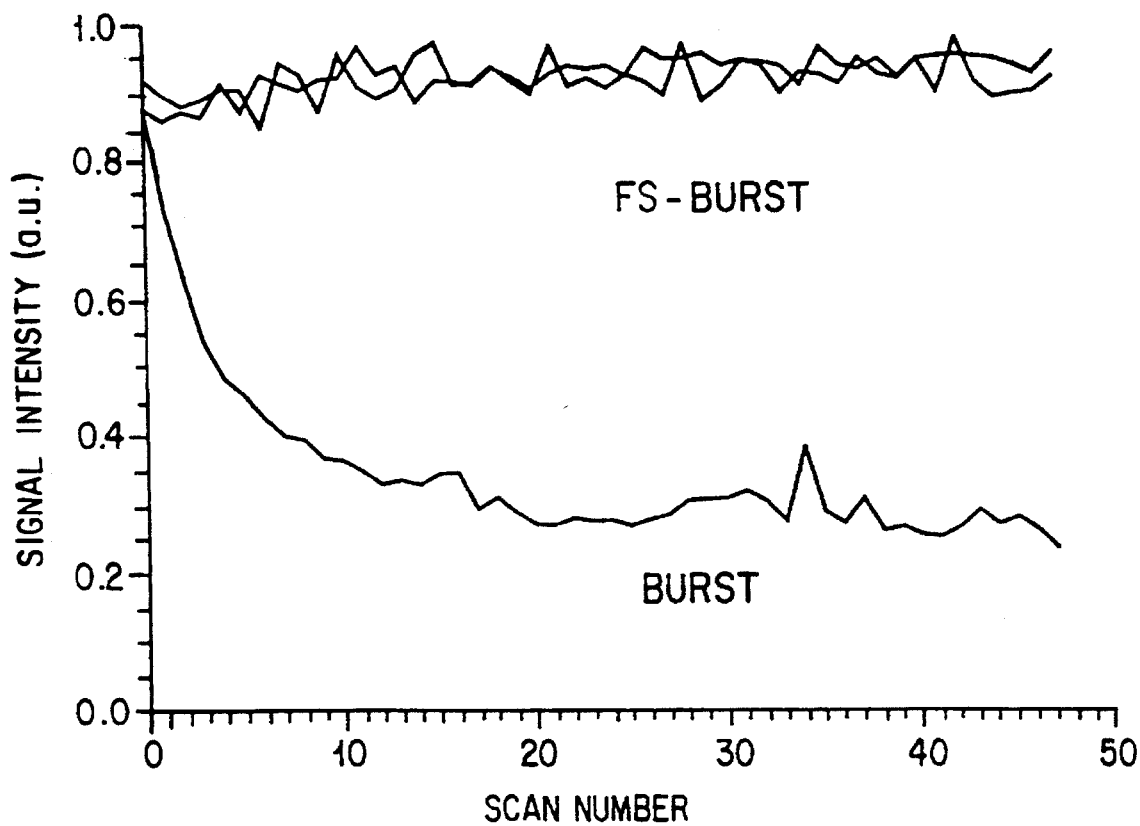
FIG. 2 is a comparison graph of saturation effects in human brain using BURST and FS-BURST imaging.

FIG. 2 shows a comparison of measurements between conventional BURST and FS-BURST using two different shifting protocols. The measurements were performed on a normal volunteer with the phase encoding gradients switched off. The BURST experiment shows a clear decay of the magnetization over time. Repeated excitations were performed without phase encoding gradients. A rapid, $T_1$-related decay of magnetization was observed with BURST. A stationary level was reached after approximately 1.3 seconds. The amount of signal loss is somewhat smaller than one would estimate based on $T_1$ effects. This is believed to be due to microscopic motion and diffusion. The loss of magnetization seen in repeated BURST measurements is not observed with FS-BURST, demonstrating the effectiveness of the shifting principle. Very little differences are seen between single and seven strip shifted FS-BURST, a finding which was also observed in the phase encoded experiments. The effectiveness of the strip shift principle in the phase encoded experiment is demonstrated in images a and b, obtained with the 3D BURST and 3D FS-BURST experiments respectively, FS-BURST shows a clear improvement in image quality and SNR.

Figure 3A:
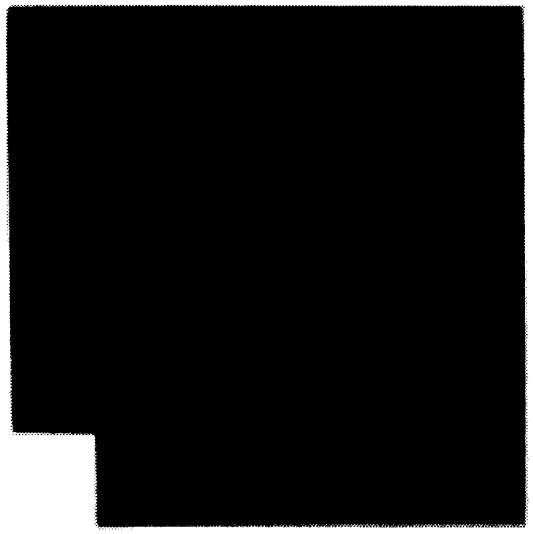
FIGS. 3a and 3b are a comparison of image quality of 3D BURST (a) and 3D FS-BURST (b) imaging.
Figure 3B:

FIG. 3 is a comparison of image quality of 3D BURST (a) and 3D FS-BURST (b). Comparison of a single corresponding slice from each dataset demonstrate the increased signal to noise ratio and reduced artifacts of FS-BURST.

FIG. 4 shows a comparison between images reconstructed from the second and first echo trains respectively. Single corresponding slices were reconstructed from second (a,c,d)

and first (b) echo train. Images a) and b) were reconstructed from a single 3D acquisition, whereas in c) and d) 20 measurements were averaged. Image d) shows the noise level of image c), in order to demonstrate the absence of distinct artifacts.

Figure 5:
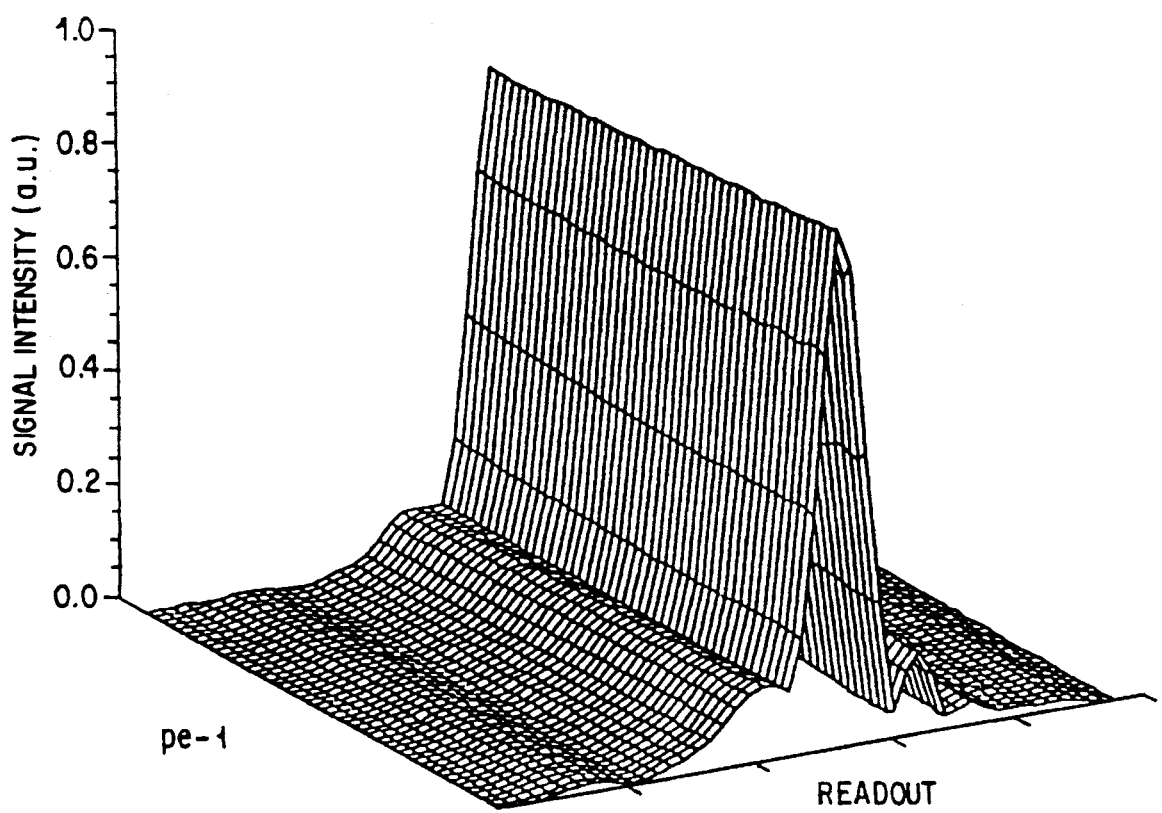
FIG. 5 is a signal intensity distribution over the second echo train.

FIG. 5 is a signal intensity distribution over the second echo train. The FS-BURST experiment was performed without phase encoding gradients, and without apodization of the BURST RF pulse train. A 3 liter bottle filled with water ($T_1$=2.5 s) was used. Although no shimming was performed, a constant signal amplitude over the echo train is observed, indicating identical $T_2^*$ —weighing for all echoes.

Figure 6:
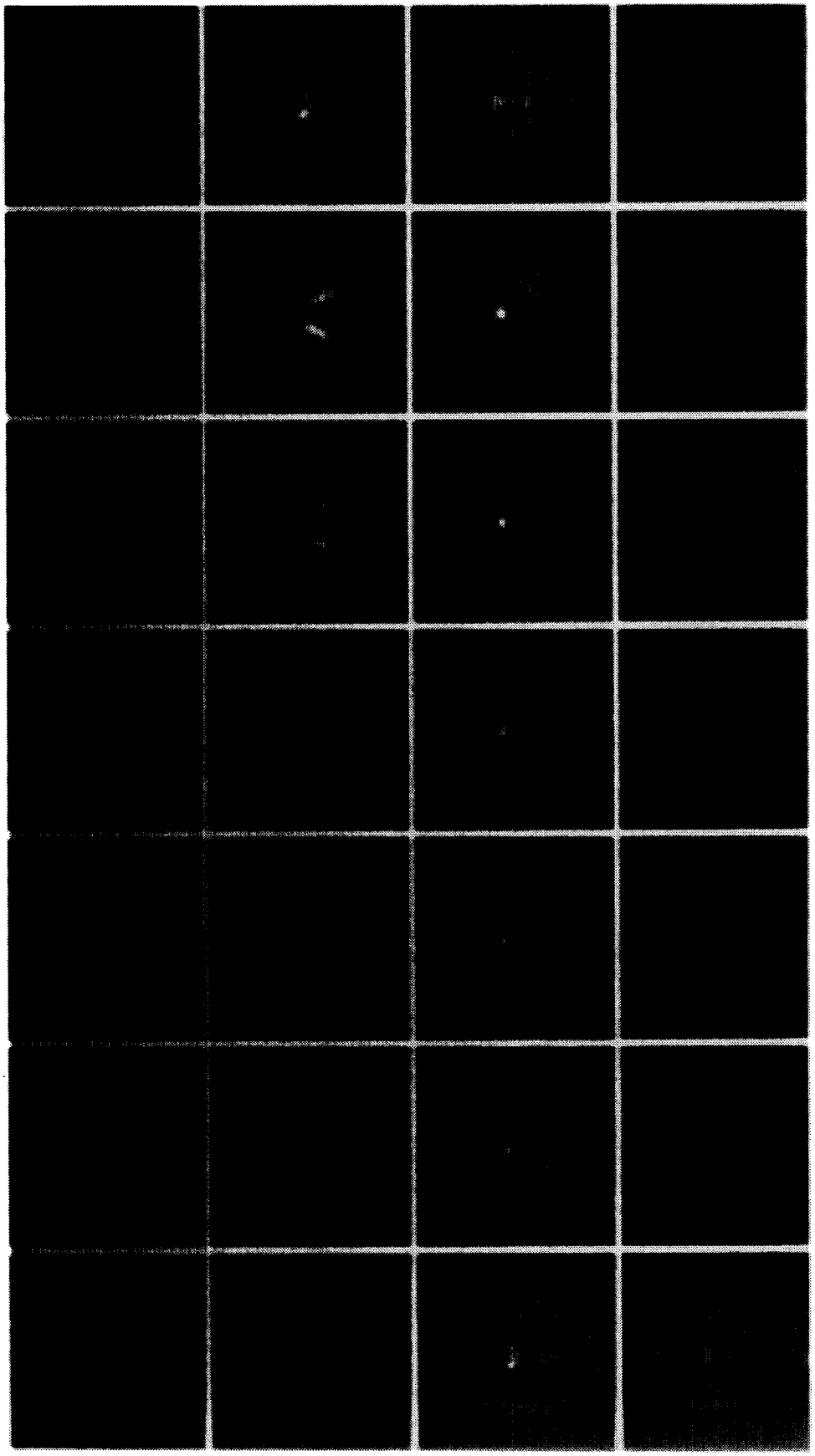
FIG. 6 shows consecutive slices through a human brain, obtained with 3D FS-BURST.

FIG. 6 shows consecutive slices through a human brain, obtained with 3D FS-BURST, 20 averages. The images were reconstructed from the second echo train. Note the excellent contrast between gray and white matter.

Figure 4A:
FIGS. 4a–4d are a comparison of image quality of 3D FS-BURST.
Figure 4B:
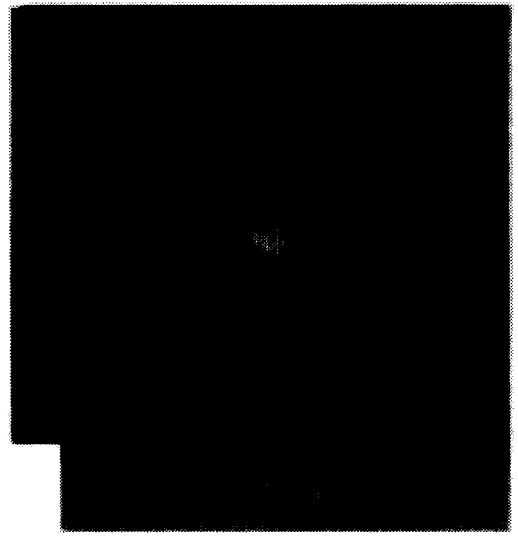
Figure 4C:
Figure 4D:
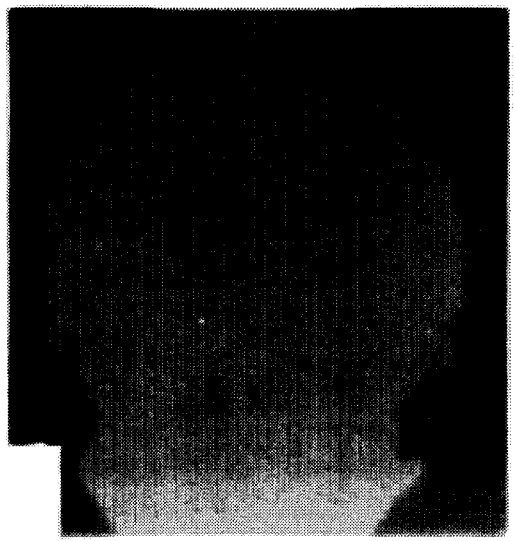

Although the image reconstructed from the first echo train has a somewhat higher SNR, it shows more distortions related to $B_o$ variations over the object. A phantom measurement without phase encoding gradients shows an equal $T_2^*$ weighing for all echoes in the second echo train (FIG. 5). In order to further investigate image quality and SNR, the FS-BURST experiment was repeated 20 times, and the results were averaged (FIG. 6, also FIG. 4c, d). Again, no significant difference was observed between the single and seven strip shift protocols. Image SNR was around 55 for gray matter. Note the excellent delineation between gray and white matter and uniform background noise, indicating minimal image artifacts.

Although the present invention has been described with reference to particular means, materials and embodiments, from the foregoing description, one skilled in the art can ascertain the essential characteristics of the present invention and various changes and modification may be made to adapt the various uses and characteristics thereof without departing from the spirit and scope of the present invention as describe in the claims which follow.

I claim:

1. A method of nuclear magnetic resonance imaging an object which comprises the steps of:
  a) positioning an object in a static magnetic field;
  b) applying a magnetic field gradient to said object;
  c) applying a burst of RF pulses to said object together with a slice selection gradient to excite a set of strips of said object and generate spin-echo signals;
  d) collecting a set of spin-echo signals produced in step c);
  e) repeating steps c) and d) a number of times after shifting a location of the excited strips of said object on successive repetitions by at least one strip width; and
  f) producing an image of said object from said sets of spin-echo signals.

2. A method of nuclear magnetic resonance imaging an object according to claim 1, further comprising shifting the location of the excited strips of said object by a plurality of strip widths in step e).

3. A method of nuclear magnetic resonance imaging an object according to claim 1, wherein step c) comprises applying said burst of RF pulses to said object together with a slice selection gradient which slice selection gradient comprises two gradients.

4. A method of nuclear magnetic resonance imaging according to claim 3, further comprising applying said two gradients of said slice selection gradient substantially perpendicular to one another.

5. A method of nuclear magnetic resonance imaging an object according to claim 3, further comprising phase encoding said sets of spin-echo signals produced in step c) by application of a continuous gradient.

6. A method of nuclear magnetic resonance imaging an object according to claim 4, further comprising phase encoding said sets of spin-echo signals produced in step c) by application of a continuous gradient which is substantially perpendicular to both of said two gradients of said slice selection gradient.

7. A method of nuclear magnetic resonance imaging an object according to claim 5, further comprising reversing said continuous gradient on subsequent sets of spin-echo signals.

8. A method of nuclear magnetic resonance imaging an object according to claim 5, further comprising applying an additional gradient to phase encode subsequent sets of spin-echo signals.

9. A method of nuclear magnetic resonance imaging an object according to claim 1, further comprising producing a three dimensional image in step f).

10. A method of nuclear magnetic resonance imaging an object according to claim 9, wherein step b) comprises positioning a brain in said magnetic field gradient.

11. A method of nuclear magnetic resonance imaging an object according to claim 1, further comprising evenly spacing said RF pulses applied in step c).

12. A method of nuclear magnetic resonance imaging an object according to claim 11, wherein step c) comprises applying between about 15 to 75 RF pulses to said object.

13. In a BURST imaging method for imaging an object wherein a set of strips of said object are excited by a burst of RF pulses, the improvement comprising repeating application of said burst of RF pulses a number of times and shifting a location of the excited strips of said object between successive repetitions of said burst RF pulses by at least one strip width.

14. An imaging method according to claim 13, wherein a three dimensional image of said object is produced from spin-echo signals produced by said burst of RF pulses.

* * * * *